United States Patent [19]

Matsumoto et al.

[11] Patent Number: 5,563,800
[45] Date of Patent: Oct. 8, 1996

[54] AUTOMATED LOGIC CIRCUIT DESIGN SYSTEM

[75] Inventors: Noriko Matsumoto, Kyoto; Tamotsu Nishiyama, Osaka, both of Japan

[73] Assignee: Matsushita Electric Industrial Co., Ltd., Osaka, Japan

[21] Appl. No.: 427,696

[22] Filed: Apr. 24, 1995

Related U.S. Application Data

[63] Continuation of Ser. No. 39,774, Mar. 26, 1993, abandoned.

[30] Foreign Application Priority Data

Mar. 30, 1992 [JP] Japan ................................. 4-073907

[51] Int. Cl.$^6$ .................................................. H01L 25/00
[52] U.S. Cl. .......................... 364/489; 364/488; 364/490; 364/491
[58] Field of Search ................................... 364/488, 489, 364/490, 491, 578

[56] References Cited

U.S. PATENT DOCUMENTS

| | | | |
|---|---|---|---|
| 4,584,653 | 4/1986 | Chih et al. ............................... | 364/491 |
| 4,703,435 | 10/1987 | Darringer et al. ...................... | 364/489 |
| 4,896,272 | 1/1990 | Kurosawa ................................ | 364/491 |
| 4,922,432 | 5/1990 | Kobayashi et al. .................... | 364/490 |
| 5,043,914 | 8/1991 | Nishiyama et al. .................... | 364/513 |
| 5,197,015 | 3/1993 | Hartog et al. .......................... | 364/490 |
| 5,282,147 | 1/1994 | Goetz et al. ............................ | 364/489 |

OTHER PUBLICATIONS

Chowdhry et al., "Minimal Area Design of Power/Ground Nets Having Graph Topologies", IEEE Transactions on Circuits and Systems, vol. CAS–34, No. 12, Dec. 1987, pp. 1441–1451.

Dutta et al., "Automatic Sizing of Power/Ground (P/G) Networks in VLSI", 26th ACM/IEEE Design Automation Conf., 1989, pp. 783–786.
Syed et al., "Single Layer Routing of Power and Ground Networks in Integrated Circuits", Journal of Digital Systems, vol. 6, No. 1, 1982, pp. 53–63.
Ruehli et al., "Analytical Power/Timing Optimization Technique for Digital System" 14th DAC, 1977, pp. 142–146.
Rothermel et al., "Computation of Power Supply Nets in VLSI Layout", 18th Design Automation Conf., 1981, pp. 37–42.
Mennecier et al., "Extension of a Compilable Cell Library with Functionalities Concerning Numerical Processing of Floating Point Data", Euro Asic '92, 1992, pp. 78–82.

Primary Examiner—Kevin J. Teska
Assistant Examiner—Stephen J. Walder, Jr.
Attorney, Agent, or Firm—McDermott, Will & Emery

[57] ABSTRACT

A logic synthesis unit generates configuration data of a virtual logic circuit composed of virtual elements, or logic gates each of which carries only a functional definition, in order to realize a logic circuit functional description fed through an input unit. A logic transformation unit, referring to a standard cell library, performs the allocation of real elements for implementation to respective virtual elements to transform the virtual logic circuit into a real logic circuit having the same function as the virtual logic circuit. Then the logic transformation unit, referring to a timing analysis unit, selects a particular real element with a smallest driving capacity from among the real elements in the library performing the same function as an object virtual element and satisfying both fan-out restrictions and delay constraints, and allocates the real element thus selected to the virtual element. Configuration data of the resulting real logic circuit are output in the forms of circuit diagrams, real element connection information lists, and the like through an output unit.

7 Claims, 7 Drawing Sheets

FIG.2(a)

| NAME OF ELEMENT | | NAND 2A | |
|---|---|---|---|
| FUNCTION | INPUT TERMINAL COUNT | NAND | 2 |
| BASIC CELL NUMBER | | 1 | |
| INPUT CAPACITANCE | | 100 | |
| FAN-OUT | | 10 | |
| DELAY | | 0.2  0.8  t  Δt  ⌐ | 0.2  1.2  t  Δt  ⌐ |

FIG.2(b)

| NAME OF ELEMENT | | NAND 2B | |
|---|---|---|---|
| FUNCTION | INPUT TERMINAL COUNT | NAND | 2 |
| BASIC CELL NUMBER | | 3 | |
| INPUT CAPACITANCE | | 200 | |
| FAN-OUT | | 20 | |
| DELAY | | 0.2  0.5  t  Δt  ⌐ | 0.2  0.6  t  Δt  ⌐ |

AUTOMATED LOGIC CIRCUIT DESIGN SYSTEM

This is a continuation of application Ser. No. 08/039,774 filed Mar. 26, 1993, now abandoned.

BACKGROUND OF THE INVENTION

This invention relates to automated logic circuit design system applicable to the design of large-scale integrated circuits (LSZ's) including microprocessors.

Top-down techniques have been used in the field of LSI design. Such a top-down technique makes a decision about detailed functions required by an LSI, generates a combination of circuit elements of first type (virtual elements) including a logic gate, a register and the like to accomplish such required functions, and transforms the generated virtual elements into circuit elements of second type (real elements) having the same functions as the corresponding virtual elements. The virtual elements are circuit elements each carrying only a functional definition, whereas the real elements, too, are circuit elements but are different from the virtual elements in that transistor configurations for implementation onto a semiconductor chip are already defined. The real elements comply with various target technologies including CMOS and TTL technologies.

The technique mentioned above has been incorporated into many different computer-aided logic design systems. Take one of these logic design systems, for example. Upon being supplied with a functional description expressed by means of high-level programming languages such as C and Prolog, this logic design system first generates configuration data of a first logic circuit (virtual logic circuit) composed of virtual elements and then outputs configuration data of a second logic circuit (real logic circuit) composed of real elements. In another logic design system, a functional description expressed in a flow chart format, which describes desired logic operations, is fed as an input. Circuit configuration data, output from the systems, takes those forms such as a real logic circuit diagram and an element connection information list. At the time when virtual elements are transformed into real elements, a standard cell library storing various information on many real elements such as information about fan-out and delay, is referred to.

In conventional logic design systems, consideration is given to fan-out restrictions and delay constraints when transforming a virtual logic circuit into a real logic circuit. To satisfy such delay constraints, conventionally, the number of real-element stages has been adjusted. No careful considerations, however, have been given to the driving capacity of real elements. This introduces a problem that the circuit transformation is done without much taking care of the characteristics of various technologies. That is, even though an optimal virtual logic circuit is obtained, this may not automatically lead to the fact that an optimal real logic circuit is realized. In addition to this problem, there is another problem that it is not possible to take full advantage of a wealth of information stored in the library.

DISCLOSURE OF THE INVENTION

It is an object of the present invention to transform a virtual logic circuit into a real logic circuit by particularly giving considerations to the driving capacity of real elements in addition to giving considerations to fan-out restrictions and delay constraints. Thus, an optimal real logic circuit is accomplished wherein the characteristics of various target technologies are well considered. It is another object of the invention for information stored in a library to be utilized most effectively.

In this invention, a real element to be allocated to a virtual element is selected from a library for circuit transformation. However, if a delay adjustment (less delay time) is required when adopting a certain real element, another real element having a greater driving capacity is selected from among all the real elements having the same function. In consequence, an optimal circuit transformation can easily be realized only by replacing one real element on a circuit path requiring a delay adjustment with the other having a greater driving capacity, without going back to the original virtual logic circuit configuration to revise it.

Further, an extended element that has a desired function as well as a configuration nonexistent in a library is generated with utilizing at least one real element stored in the library, thereby making it possible to select such an extended element as a circuit element to be allocated to a virtual element. An advantageous circuit transformation over prior art techniques is now achieved while taking full advantage of a wealth of information stored in the library.

BRIEF DESCRIPTION OF THE DRAWINGS

In the appended drawings:

FIGS. 2(a) and 2(b) show examples of information on real elements belonging in a standard cell library of FIG. 1;

PREFERRED EMBODIMENTS OF THE INVENTION

Figure 1:
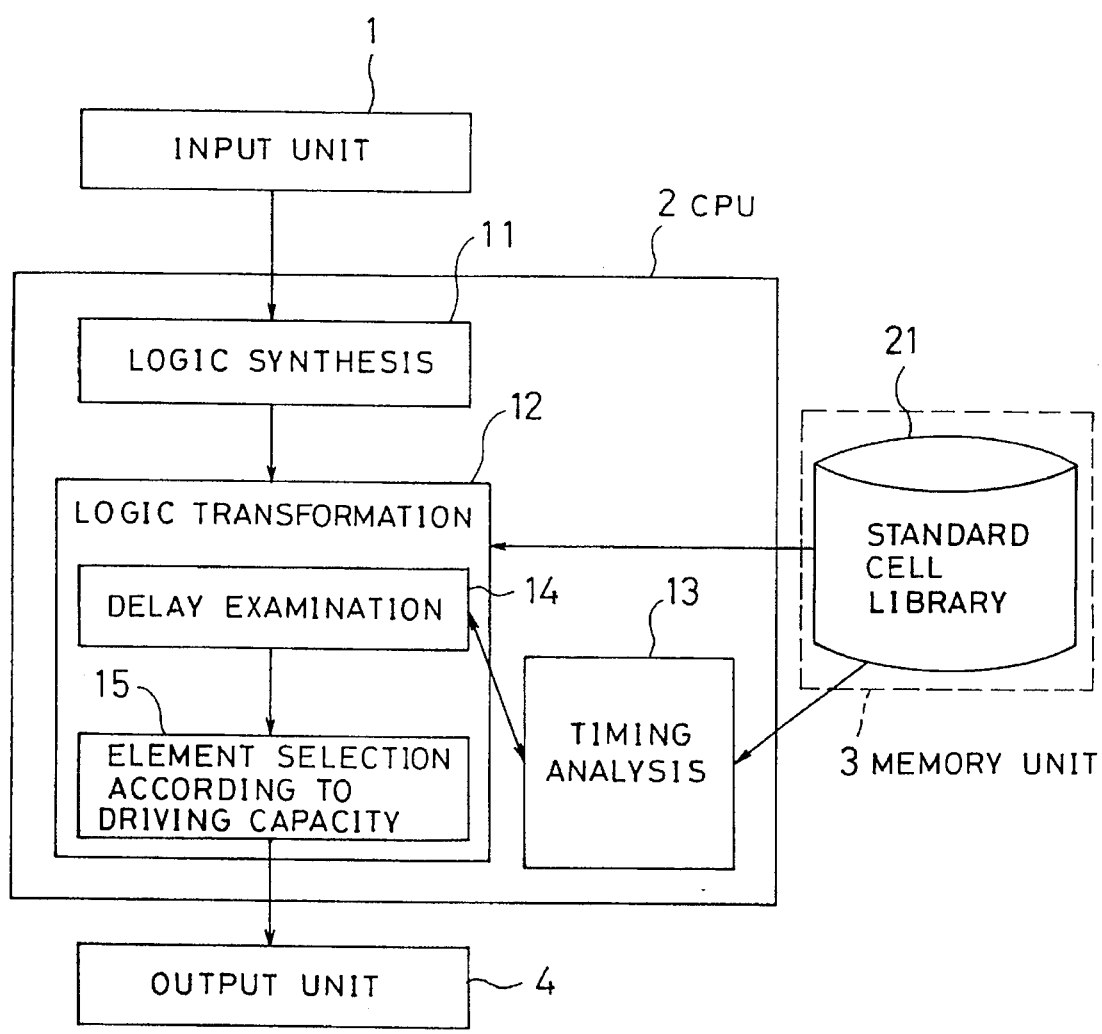
FIG. 1 is a block diagram illustrating the organization of a logic design system of a first embodiment of the present invention.

With reference to the appended drawings two logic design systems in accordance with the present invention are described.

A first logic design system is explained by reference to FIG. 1, which comprises an input unit 1, a central processing unit (CPU) 2, a memory unit 3, and an output unit 4.

The input unit 1 is an input device, which inputs a functional logic description into the CPU 2, and is chosen from among those input devices such as a card reader and a schematic entry system. Such a functional description may be fed through one of the files in a magnetic-disk unit.

The memory unit 3 pre-stores a program for the CPU 2 to execute it, and includes a standard cell library 21. As illustrated by FIG. 2(a) and FIG. 2(b), the standard cell library 21 has various collections of information on many real elements.

The CPU 2 is a unit to find configuration data of a real logic circuit from a functional description. The CPU 2 contains (a) a logic synthesis unit 11 to generate from a functional description a virtual logic circuit composed of virtual elements (hereinafter referred to as the "logic gates"), (b) a logic transformation unit 12 to transform the generated virtual logic circuit into a real logic circuit by referring to the standard cell library 21, and (c) a timing analysis unit 13 to make a delay analysis on the obtained real logic circuit. A general-purpose computer, engineering workstation, or personal computer may serve as the CPU 2. The logic transformation unit 12 is formed by two units, that is, a delay examination unit 14 and an element selection unit 15. The delay examination unit 14 checks for the necessity of delay adjustment (less delay time). The element selection unit 15 selects from the standard cell library 21 an optimal real element to be allocated to each logic gate.

The output unit 4 is a device which outputs the configuration data of the obtained real logic circuit. The output unit 4 is selected from among those devices such as a graphic display unit and a plotter. Circuit configuration data may be fed to one of the files in a magnetic-disk unit.

As shown in FIG. 2(a), the standard cell library 21 stores real-element information, i.e., information about a NAND element 2A, namely its function, input terminal count, basic cell number (area index), input capacitance (relative value), fan-out, delay (in ns), and the like. The delay information, however, is divided into t and $\Delta t$ at the positive edge and negative edges of a pulse. t indicates the delay time between the input and output terminals of the element at the time when no output load is applied, and $\Delta t$ the delay time increment per given load. The driving capacity of this NAND element 2A is evaluated by $\Delta t$. When $\Delta t$ is small, the driving capacity of the NAND element 2A is great. Conversely, when $\Delta t$ is great, the driving capacity is small. It is seen from FIG. 2(b) that the NAND element 2B has a greater driving capacity than the NAND element 2A of FIG. 2(a).

Figure 3:
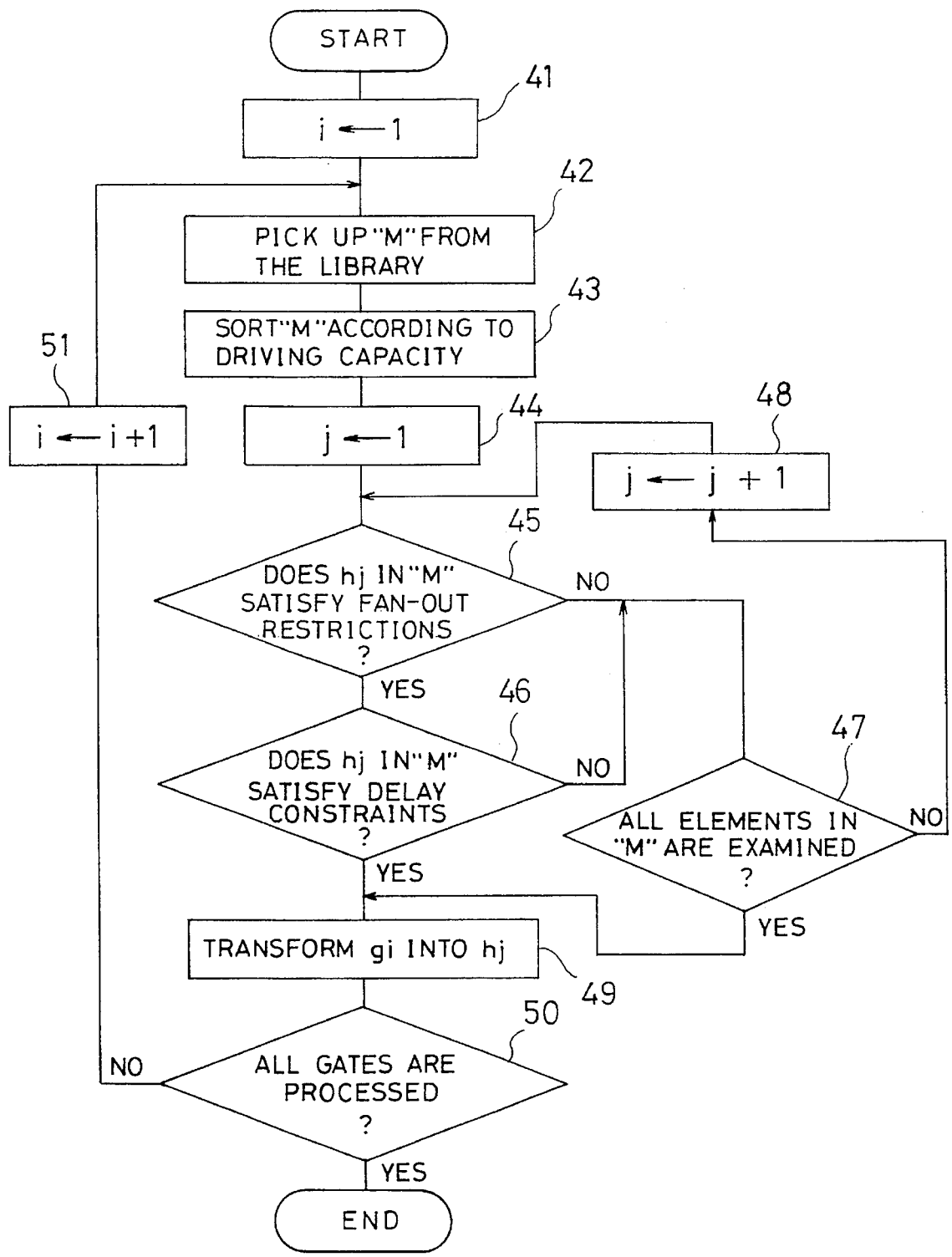
FIG. 3 is a flow chart illustrating the allocation process of circuit elements in the logic design system of FIG. 1.

How the logic transformation unit 12 of FIG. 1 executes the allocation of circuit elements is explained with the help of FIG. 3.

The process starts with Step 41 determining, from among a plurality of logic gates gi in a virtual logic circuit generated by the logic synthesis unit 11, particular one to be dealt with first. Step 42 selects from the standard cell library 21 a plurality of real elements having the same function as the determined logic gate gi mentioned above. These selected real elements constitute a SET M. Step 43 sorts constituents of such a SET M according to the values of $\Delta t$ to arrange them in order of driving capacity. Step 44 determines, from among the constituents hj of the SET M sorted at Step 43, first particular one having a smallest driving capacity as an allocation candidate, Step 45 judges whether or not a given fan-out restriction is satisfied when transforming the logic gate gi into the real element hj.

If the given fan-out restriction is not satisfied, then Step 47 makes a final element judgment on the SET M. Step 48 makes j become increased by one. Then Step 45 deals with another real element having a next greater driving capacity. If the given fan-out restriction is satisfied, the process advances from Step 45 to Step 46.

Step 46, by making use of the timing analysis unit 13, evaluates the delay of a circuit path passing through the real element hj in a real logic circuit under preparation, and judges whether or not a given delay constraint is satisfied if the logic gate gi is transformed into the real element hj. In other words, this step checks for the necessity of delay adjustment (less delay time).

If delay adjustment is required, Step 47 makes a final element judgment on the SET M. Then Step 48 makes j become increased by one. Then Step 45 deals with another real element having a next greater driving capacity. If the delay adjustment is unnecessary, the logic gate gi is transformed into the real element hi at Step 49. After Step 50 makes a final gate judgment on all the gates in the virtual logic circuit, Step 51 makes i become increased by one. Then Step 42 restarts dealing with a next logic gate, and the process advances "downstream". If the real elements of the SET M only satisfy either the fan-out restriction or the delay constraint, the real element hj having the greatest driving capacity among the SET M is allocated to the logic gate gi as the process advances from Step 47 to Step 49.

For the case of a virtual logic circuit containing a register, the delay judgment at Step 46 further includes check-ups on the set-up time, the holding time and the like. In the foregoing example, the driving capacities of the real elements are evaluated by their values of $\Delta t$. However, such may be evaluated by the values of fan-outs, it may be possible to sort, in advance, real-element information stored in the standard cell library 21 according to the values of $\Delta t$ or fan-out indicating the driving capacity. The driving capacity of the real element may be evaluated at the time when judgment on fan-out as well as on delay is made, by extracting an arbitrary constituent from the SET M.

Figure 4:
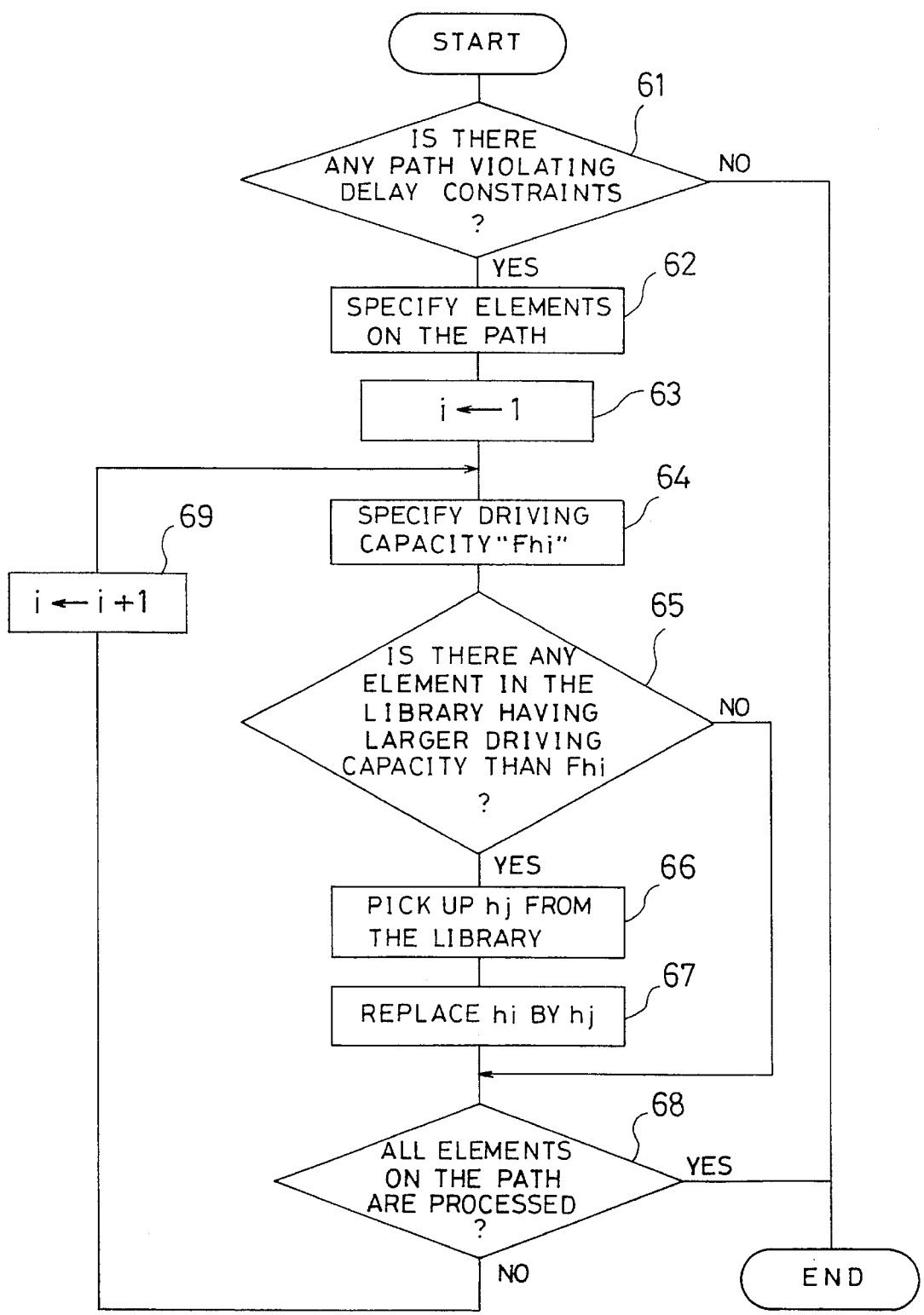
FIG. 4 is a flow chart illustrating the delay adjustment process of a real logic circuit in the logic design system of FIG. 1.

The real logic circuit obtained by the above-described circuit transformation is subjected to a further examination, that is, such a real logic circuit is checked if it contains a circuit path violating delay constraints. If a delay-constraint violating circuit path is found, a delay adjustment is carried out. With reference to FIG. 4, how the logic transformation unit 12, shown in FIG. 1, executes such a delay adjustment on a real logic circuit with a delay-constraint violating circuit path.

Step 61, by making use of the timing analysis unit 13, checks for the presence or absence of a delay-constraint violating circuit path in the real logic circuit. If no delay-constraint violating circuit paths are found, the process is completed. If there is a circuit path requiring a delay adjustment (less delay time), Step 62 determines a group of real elements on such a circuit path. Step 63 further determines, from the group of real elements hi, the specific one to be dealt with first.

At Step 64 the driving capacity (Fhi) of the object real element hi to be processed is found. Step 65 then checks for the presence or absence of another real element that performs the same function as the real element hi determined at Step 63 and has a greater driving capacity than the driving capacity Fhi of the determined real element hi, in the standard cell library 21. If such a real element is nonexistent in the standard cell library 21, in other words, if the Fhi is the greatest of all the driving capacities of the real elements having the same function, Step 68 makes a final element judgment on the group of real elements on the object circuit path. Step 69 then makes i become increased by one. Step 64 then deals with another real element to be dealt with next. If there is a real element having a greater driving capacity than Fhi in the standard cell library 21, Step 66 selects that real element hj, and the real element hi mentioned above is replaced by such a real element hj. If there are two or more real elements having a greater driving capacity than Fhi, one of these real elements having a next greater driving capacity to Fhi should be treated as the real element hj to be allocated.

The above-described series of processing comprising Steps 61 to 69 is repeated until no circuit paths violating the delay constraints exist in the real logic circuit obtained by means of the foregoing circuit transformation.

In accordance with this embodiment, a real element, which is to be allocated to a logic gate, is chosen from the standard cell library 21, however, in the case that delay adjustment (less delay time) is required when adopting a certain real element, another real element with a greater driving capacity is chosen from among all the real elements having the same function. As a result, an optimal circuit transformation can easily be realized by merely replacing a real element on a circuit path with another having a greater driving capacity, without going back to the virtual logic circuit configuration by the logic synthesis unit 11 to revise it. In addition, the following advantages are obtained.

Firstly, because the above-described driving capacity evaluation process is introduced, this embodiment will perform an automated, high-speed delay adjustment as carefully as the skilled designers do.

Secondly, this embodiment is able to take full advantage of the library storing a wealth of information on many real elements, in order to accomplish an optimal circuit transformation while taking care of the characteristics of various target technologies very much.

Figure 5:
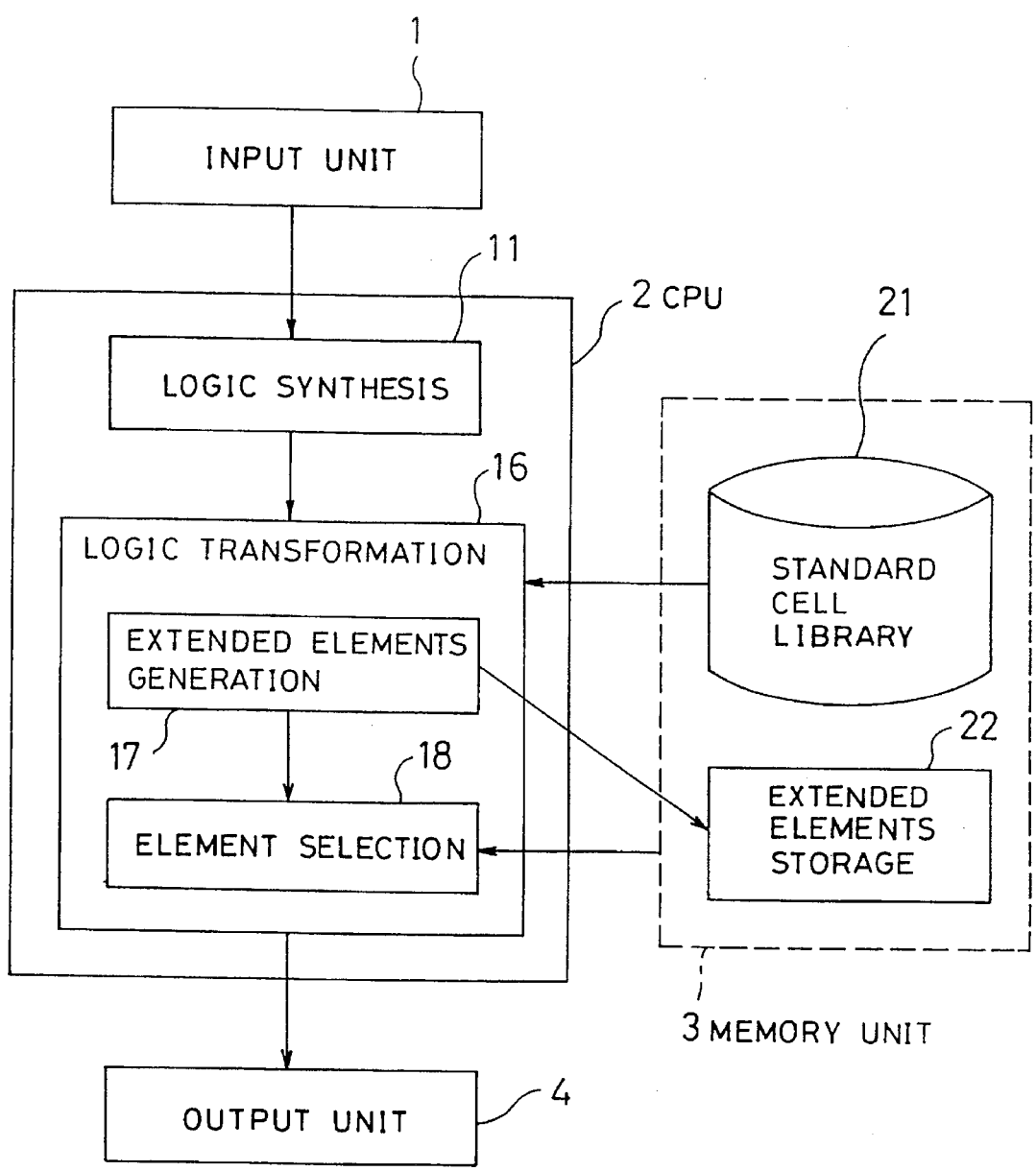
FIG. 5 is a block diagram illustrating the organization of a logic design system of a second embodiment of the invention.

Next, a second logic design system of the invention of FIG. 5 is explained, which, like the one as shown in FIG. 1, comprises the input unit 1, the central processing unit (CPU) 2, the memory unit 3, and the output unit 4. The CPU 2, however, contains a logic transformation unit 16, which is composed of two units, namely, (a) an extended-elements generation unit 17 to generate extended elements (that is, real elements nonexistent in the standard cell library 21) and (b) an element selection unit 18 to select an optimal real element to be allocated to each individual logic gate in a virtual logic circuit. The memory unit 3 contains, in addition to the standard cell library 21, an extended elements storage unit 22 that stores respective information on the extended elements generated by the extended elements generation unit 17.

Figure 6A:
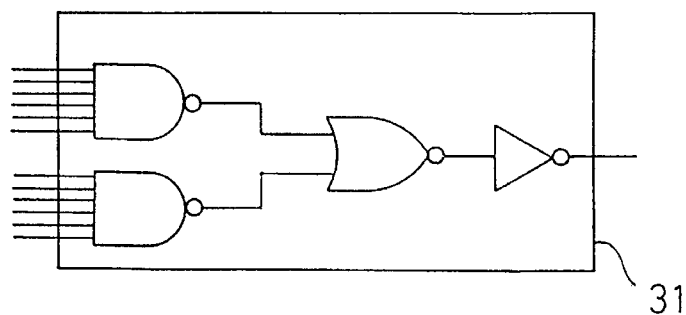
FIGS. 6(a) and 6(b) show configuration examples of real elements belonging in a standard cell library of FIG. 5.

In accordance with FIG. 6(a), the standard cell library 21 stores real-element information on a 12-input NAND element 31 comprising two 6-input NAND elements at the first stage, one 2-input NOR element at the second stage, and one inverter element at the third stage. In accordance with FIG. 6(b), likewise, the standard cell library 21 stores real-element information on a 16-input NAND element 32 comprising four 4-input NAND elements at the first stage, two 2-input NOR elements at the second stage, and one 2-input NAND element at the third stage. The function of the 16-input NAND element 32 covers the function of the 12-input NAND element 31. However, the internal delay of the 12-input NAND element 31 is greater than that of the 16-input NAND element 32, since the 16-input NAND element 32 has the 4-input NAND elements at the first stage whereas the 12-input NAND element 31 has the 6-input NAND elements where delay is great at the first stage, although both the NAND elements 31 and 32 has a 3-stage logic configuration.

Figure 6B:
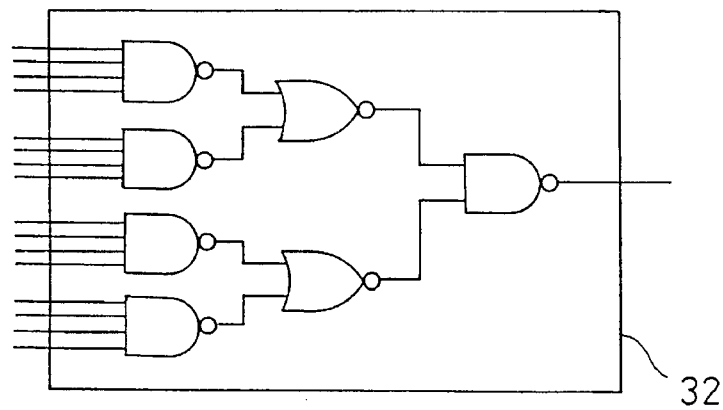
Figure 7:
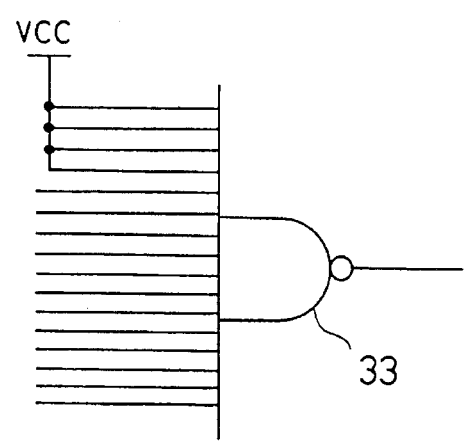
FIG. 7 is an illustration showing an extended element generated with utilizing a real element shown in FIG. 6(b).

An extended element as an example, generated by the extended-elements generation unit 17, is shown in FIG. 7. As seen from the figure, the 16-input NAND element 32 of FIG. 6(b) is so modified that four of the 16 input terminals of the NAND element 32 are connected to a power line, NAND element 33 is formed. Take a case where a real element is allocated to a 12-input NAND gate in a virtual logic circuit, for example. The 12-input NAND element 31 of FIG. 6(a) should be selected if priority is given to the area reduction of a real logic circuit, while on the other hand the 12-input NAND element 33 of FIG. 7 should be selected if priority is given to the delay reduction. This selection between the 12-input NAND element 31 and the 12-input NAND element 33 is done by the element selection unit 18.

Figure 8:
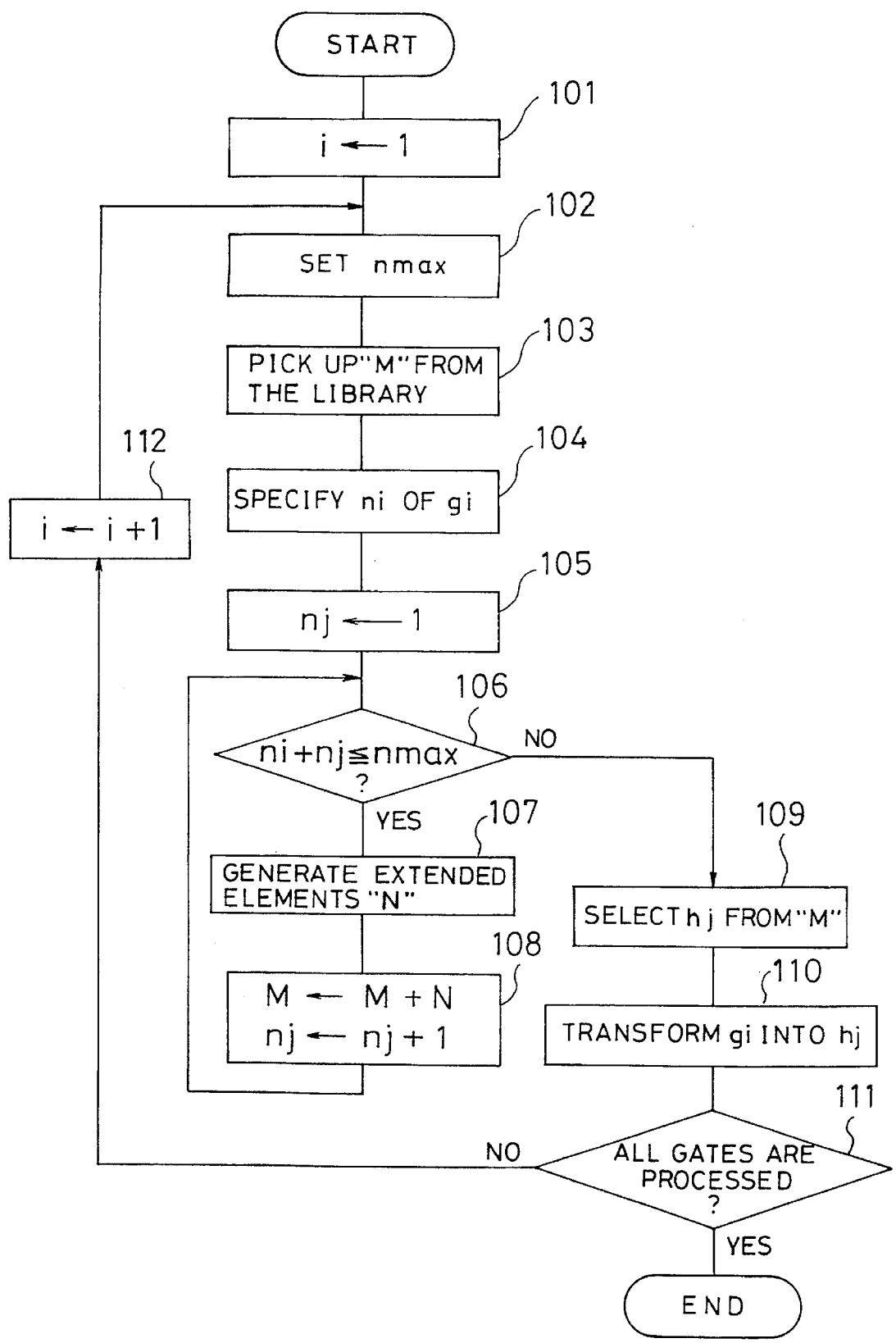
FIG. 8 is a flow chart illustrating the allocation process of circuit elements in the logic design system of FIG. 5.

How the logic transformation unit 16 of FIG. 5 executes the allocation of circuit elements is explained with the help of FIG. 8.

This process starts with Step 101 determining, from among a plurality of logic gates gi in a virtual logic circuit generated by the logic synthesis unit 11, particular one to be dealt with first. Step 102 finds nmax that is a maximum value of the input terminal count from many real elements belonging in the standard cell library 21 and falling into the same functional category as the logic gate gi determined at Step 101. For example, for the case of the logic gate gi being a NAND gate, a search for a NAND element that has the greatest input terminal count is made, and such a maximum value becomes nmax. Step 103 selects from the standard cell library 21 particular real elements having the same function as well as having the same number of input terminals as the determined logic gate gi, such real elements selected constitute a SET M. Step 104 specifies ni, i.e., the input terminal count of the logic gate gi.

Step 105 sets nj (i.e., the number of input signals to be added to the logic gate gi) to one. Step 106 judges whether or not $ni+nj \leq nmax$. If $ni+nj \leq nmax$, the process advances to Step 107 for further processing. To maintain the function of the logic gate gi, Step 107 devises a provisional logic gate by adding nj input signals ("0s" or "1s") to the logic gate gi mentioned above and picks up, if a real element corresponding to such a provisional logic gate exists in the standard cell library 21, the real element. Part of the input terminals of the real element thus picked up is then connected either to a power line or to a ground line to generate an extended element. Such extended elements generated constitute a SET N. Information on this SET N is stored in the extended-elements storage unit 22. AT Step 108, the SET N is added to the SET M to form a new SET M and nj becomes increased by one. Then the process returns to Step 106.

Zf ni+nj becomes greater than nmax, the processes of Step 109, 110, and 111 are executed. Step 109 selects an optimal real element hj to be allocated to the logic gate gi from among constituents of the SET M obtained by the steps from Step 102 to Step 108, by evaluating, at this point in time, the area of the real logic circuit, the delay time, and the like. Step 110 transforms the logic gate gi into such a real element hj. Step 111 executes a final gate judgment on all the gates in the virtual logic circuit. Step 112 makes become increased by one. Then the process returns to Step 102 to deal with a next logic gate.

It may be possible to first select from the standard cell library 21 a real element having more input terminals than the determined logic gate gi, and then to bring part of the input terminals of the real element thus selected into contact either with a power line or with a ground line to generate an extended element having the same function as the logic gate gi. For example, if the standard cell library 21 stores no 15-input NAND elements, the 16-input NAND element 32 of FIG. 6(b) is selected. Then one of the 16 input terminals of such a 16-input NAND element 32 is connected to a power line to generate an extended element which, in place of a 15-input NAND element, is allocated to a 15-input NAND gate in the virtual logic circuit, In accordance with this example, less delay is accomplished as compared to a case where an extended 15-input NAND of 3-stage configuration formed by connecting a 4-input NAND element and an inverter element to the input side of the 12-input NAND element 31 of FIG. 6(*a*).

An extended element by combining a plurality of real elements stored in the standard cell library 21 may be employed. For example, by making use of an extended element formed by connecting one or more buffer elements to the output side of a certain real element, the allocation of a real element having a greater driving capacity can be accomplished. Further, delay matching of a plurality of circuit paths in a real logic circuit can be realized.

In accordance with this embodiment, a real element in the standard cell library 21 is directly used as an allocation circuit element capable of being allocated to a logic gate. Moreover, an extended element with a different configuration that is nonexistent in the standard cell library 21 can be generated, which allows such an extended element to be selected as an allocation circuit element. As a result, the information stored in the standard cell library 21 is effectively utilized. In addition, the following advantages can be obtained.

Firstly, the present logic design system automatically accomplishes an circuit optimization technique to connect part of the input terminals of a real element either to a power line or to a ground line. In other words, a high-quality computer-aided logic design comparable to one by manual design can be achieved, resulting in reducing the number of design steps and improving the quality of design.

Secondly, a library storing information on real elements with elaborate structures is fully utilized so that an optimal circuit transformation can be realized while fully taking into account the characteristics of various target technologies.

Lastly, even a library, where the numbers of input terminals of real elements belonging to the same functional category are not in sequence, can be utilized effectively.

We claim:

1. A transformation method in a computer-aided automatic logic circuit design for transforming a first logic circuit into a second logic circuit having the same function as the first logic circuit, wherein the first logic circuit is formed by circuit elements of a first type, each of which carries only a functional definition, while the second logic circuit is formed by circuit elements of a second type for implementation of the second logic circuit, the transformation method comprising the steps of:

obtaining information on circuit elements of a second type from a library in a memory unit corresponding to circuit elements of a first type;

generating information on extended circuit elements of a second type corresponding to said circuit elements of a second type obtained from said library; and selecting optimal circuit elements of a second type from said extended circuit elements of a second type and said circuit elements stored in said memory that perform the same function as the particular circuit elements in said first logic circuit.

2. The transformation method according to claim 1, wherein said step of generating information on extended circuit elements includes the steps of:

selecting from a library a circuit element of a second type whose function includes that of the particular circuit element of a first type; and generating an extended circuit element by modifying the configuration of the selected circuit element of a second type.

3. The transformation method according to claim 2, wherein said step of modifying the configuration of the selected circuit element of a second type includes the step of:

connecting a required number of input terminals of the selected circuit element of a second type either to a power line or to a ground line.

4. The transformation method according to claim 1, wherein said step of generating information on extended circuit elements includes the step of:

combining information on a plurality of circuit elements of a second type from a library in a memory unit corresponding to circuit elements of a first type.

5. The transformation method according to claim 1, wherein said step of generating information on extended circuit elements includes the step of:

generating information on a circuit elements of a second type that are nonexistent in said library unit but that correspond to the functions of the circuit elements of a first type.

6. The transformation method according to claim 1, wherein said step of selecting optimal circuit elements includes the step of:

evaluating the area and delay time of a logic circuit of a second type with and without extended circuit elements.

7. A computer-aided logic design system for obtaining configuration data a logic circuit composed of circuit elements from a functional description of said logic circuit, the computer-aided logic design system comprising:

an input unit for inputting a functional description of a logic circuit to a central processing unit including a logic synthesis unit and a logic transformation unit:

said logic synthesis unit for generating configuration data for a first logic circuit composed of circuit elements of a first type from said functional description of said logic circuit inputted to said central processing unit, in order to realize the logic circuit description fed through said input unit;

a memory unit having a library of information stored therein on circuit elements of a second type for implementation of circuit elements of said second type corresponding to said circuit elements of said first type;

said logic transformation unit for transforming said configuration data for said first logic circuit generated by said logic synthesis unit into a second logic circuit having the same function as said first logic circuit, including an extended-elements generation unit for generating extended circuit elements of a second type and an element selection unit for selecting optimal circuit elements of a second type from among said extended circuit elements and said circuit elements stored in said memory that perform the same function as the particular circuit elements in said first logic circuit; and an output unit for outputting configuration data for said second logic circuit obtained by said logic transformation unit.

\* \* \* \* \*

UNITED STATES PATENT AND TRADEMARK OFFICE
CERTIFICATE OF CORRECTION

PATENT NO. : 5,563,800
DATED : October 8, 1996
INVENTOR(S) : N. MATSUMOTO et al.

It is certified that error appears in the above-indentified patent and that said Letters Patent is hereby corrected as shown below:

Col. 8, line 30, before "obtaining", insert --automatically--; and line 41, before "description", insett --functional--.

Signed and Sealed this

Thirteenth Day of May, 1997

Attest:

BRUCE LEHMAN

*Attesting Officer*  *Commissioner of Patents and Trademarks*